(12) United States Patent
Mann et al.

(10) Patent No.: US 11,071,235 B2
(45) Date of Patent: Jul. 20, 2021

(54) AIRFLOW BALANCING ASSEMBLY

(71) Applicant: International Business Machines Corporation, Armonk, NY (US)

(72) Inventors: Phillip Mann, Rochester, MN (US); Sandra J. Shirk/Heath, Rochester, MN (US); Mark Plucinski, Toms River, NJ (US); Tyler Jandt, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/224,517

(22) Filed: Dec. 18, 2018

(65) Prior Publication Data

US 2020/0196487 A1    Jun. 18, 2020

(51) Int. Cl.
*H05K 7/20*    (2006.01)

(52) U.S. Cl.
CPC ..... *H05K 7/20572* (2013.01); *H05K 7/20181* (2013.01); *H05K 7/20772* (2013.01)

(58) Field of Classification Search
CPC ........... H05K 7/20572; H05K 7/20209; H05K 7/20727; H05K 7/20718; H05K 7/20836; H05K 7/20136; G06F 1/20; G06F 1/206; G06F 1/203; G06F 11/2058; F24F 11/65; F24F 11/0001; F24F 11/63; F24F 2203/052; G11B 33/142; G11B 33/1486
USPC .............. 361/695, 679.48–679.51, 724–727; 165/205, 208–209, 212–214
See application file for complete search history.

(56) References Cited

U.S. PATENT DOCUMENTS

| 4,648,007 | A | | 3/1987 | Garner | |
|---|---|---|---|---|---|
| 5,544,012 | A | * | 8/1996 | Koike | H05K 7/20572 361/695 |
| 5,572,403 | A | * | 11/1996 | Mills | G06F 1/20 165/104.34 |
| 5,793,610 | A | * | 8/1998 | Schmitt | H05K 7/20581 165/80.3 |
| 6,163,454 | A | * | 12/2000 | Strickler | H05K 9/0041 174/384 |
| 6,587,340 | B2 | | 7/2003 | Grouell et al. | |

(Continued)

FOREIGN PATENT DOCUMENTS

EP    320720 A2    6/1989

OTHER PUBLICATIONS

HGST "System Specification Document", 4U60 Storage Enclosure, G460-J-12, Nov. 2015, 1ET0159, Revision 1.1, Long Live Data, hgst.com.

*Primary Examiner* — Zachary Pape
*Assistant Examiner* — Amir A Jalali
(74) *Attorney, Agent, or Firm* — Patterson + Sheridan, LLP (57) ABSTRACT

Method and apparatus includes a chassis to house circuitry, the chassis having first and second surfaces and an air inlet. An airflow moving device may create an airflow in a first direction that is communicated to the chassis via the air inlet. A wall structure may have a height that extends up from a base of the wall structure in a second direction that is substantially perpendicular to the first direction of the airflow, where the base of the wall structure directly contacts the first surface and forms an elongated opening along a top surface of the wall structure and in between the second surface of the chassis. The airflow may flow over the top surface of the wall structure.

14 Claims, 11 Drawing Sheets

(56) References Cited

U.S. PATENT DOCUMENTS

| | | | |
|---|---|---|---|
| 6,912,129 B2* | 6/2005 | Baker | G06F 1/20 165/80.3 |
| 8,840,453 B2 | 9/2014 | Izuno et al. | |
| 8,988,877 B2* | 3/2015 | Cash | G06F 1/20 361/679.5 |
| 9,578,786 B1* | 2/2017 | Beall | H05K 7/20754 |
| 10,542,634 B2* | 1/2020 | Anderl | F04D 25/166 |
| 2005/0259393 A1* | 11/2005 | Vinson | H05K 7/20727 361/690 |
| 2005/0260944 A1* | 11/2005 | Vinson | F04D 29/545 454/184 |
| 2006/0152901 A1* | 7/2006 | Espinoza-Ibarra | F04D 29/382 361/695 |
| 2006/0199498 A1* | 9/2006 | Shipley | H05K 7/20572 454/184 |
| 2007/0133168 A1* | 6/2007 | Shabany | H05K 7/20581 361/695 |
| 2007/0230118 A1* | 10/2007 | Leija | H05K 7/20718 361/690 |
| 2008/0217962 A1* | 9/2008 | Boduch | H05K 7/1425 296/204 |
| 2009/0016019 A1* | 1/2009 | Bandholz | G06F 1/20 361/695 |
| 2009/0109612 A1* | 4/2009 | Moss | G06F 1/20 361/679.48 |
| 2011/0299240 A1* | 12/2011 | Kimura | G06F 1/20 361/679.49 |
| 2012/0083196 A1* | 4/2012 | Mockridge | H05K 7/20745 454/184 |
| 2013/0105107 A1* | 5/2013 | Chen | H05K 7/20836 165/11.1 |
| 2014/0338865 A1* | 11/2014 | Ross | F24F 5/0035 165/104.34 |
| 2015/0109733 A1* | 4/2015 | Horiuchi | H05K 7/20136 361/695 |
| 2016/0037676 A1* | 2/2016 | Gaal | H05K 7/20572 361/695 |
| 2016/0165750 A1* | 6/2016 | Tang | H05K 7/20172 361/692 |
| 2016/0174413 A1* | 6/2016 | Steinbrecher | H05K 7/20727 361/679.51 |
| 2016/0216717 A1* | 7/2016 | Elliott | G05D 7/0658 |
| 2017/0045255 A1* | 2/2017 | Karamanos | G05D 7/0635 |
| 2017/0118874 A1* | 4/2017 | Lin | H05K 7/20745 |
| 2017/0273220 A1* | 9/2017 | Nagasaka | H05K 7/20727 |
| 2017/0295673 A1* | 10/2017 | Anderl | H05K 7/20727 |
| 2018/0206361 A1* | 7/2018 | Shirakami | H05K 7/20145 |
| 2019/0116688 A1* | 4/2019 | Chu | H05K 7/20154 |

* cited by examiner

AIRFLOW BALANCING ASSEMBLY

BACKGROUND

The present invention relates to the field of thermal cooling for electronic devices, and more specifically, to adjustable cooling of heat-generating components in computer systems.

In conventional computer systems, the air flows from blowers into a plenum. Plenums are used to distribute the airflow to multiple desired locations. When a fan fails, the airflow distributes in a way that is not optimal. Airflow does not necessarily go to all of the hot components in an optimal way.

SUMMARY

According to one particular embodiment, a method of providing cooling to electronics housed within a chassis, the method includes providing a chassis to house circuitry, the chassis having first and second surfaces, and an air inlet; providing an airflow moving device to create an airflow in a first direction that is communicated to the chassis via the air inlet; providing a wall structure having a height that extends up from a base of the wall structure in a second direction that is substantially perpendicular to the first direction of the airflow, where the base of the wall structure directly contacts the first surface and forms an elongated opening along a top surface of the wall structure and between the second surface of the chassis, and enabling the air to flow over the top surface of the wall structure.

According to another particular embodiment, an apparatus includes a chassis to house circuitry, the chassis having first and second surfaces and an air inlet. An airflow moving device may create an airflow in a first direction that is communicated to the chassis via the air inlet. A wall structure may have a height that extends up from a base of the wall structure in a second direction that is substantially perpendicular to the first direction of the airflow, where the base of the wall structure directly contacts the first surface and forms an elongated opening along a top surface of the wall structure and in between the second surface of the chassis. The airflow may flow over the top surface of the wall structure.

According to another particular embodiment, a program product is configured to initiate cooling electronic components house in a chassis includes a computer readable storage medium having computer readable program code embodied therewith, the computer readable program code executable by a processor to access the memory and to execute the program code to control an airflow moving device to create an airflow in a first direction that is communicated to a chassis via an air inlet; control a wall aperture in a wall structure having a height that extends up from a base of the wall structure in a second direction that is substantially perpendicular to the first direction of the airflow, wherein the base of the wall structure directly contacts a first surface and forms an elongated opening along a top surface of the wall structure and between the second surface of the chassis; and cause the air to flow over the top surface of the wall structure.

DETAILED DESCRIPTION

An embodiment includes a system that may rebalance the airflow out of a plenum once a fan has failed. In the current state of the art the plenum may include a static structure that does not adjust to the loss of a fan. Additionally, the system may allow for optimizing the airflow out of a plenum when all the fans are working. The plenum components may be adjusted for things such as different system features and voltage levels at the fan.

A specially shaped plenum wall allows for an efficient redistribution of airflow during a fan fail. A partially-high wall can be used for airflow moving devices (AMDs) that are biased to either the top or the bottom of a server cooling path by utilizing the typical exhaust path of such AMDs (such as blowers). Total impedance required for an effective distribution of airflow during a fan fail can be reduced by utilizing a wall shaped plenum instead of the typical perforated plenum. Furthermore, louvers or the like could be used to form the wall such that the impedance of the plenum during normal operation can be minimized. When an AMD fails, the louvers would close and form the wall plenum again, and provide superior operation than a normal plenum.

An embodiment may include a strategically positioned wall that remains stationary after a fan fail. In one embodiment, a louver system may be used. The system may be a static, fixed, unchanging wall that is positioned to create a low impedance plenum for effectively cooling the system. This disclosure does not improve system reliability during fan fail scenarios and does not improve overall system impedance during normal operation.

An embodiment may include a solid vertical wall near air exhaust. The air has to pour over the wall. Airflow is not reduced, but the direction of the airflow is changed. Air flows over the wall to evenly distribute throughout the entire chassis. An embodiment of the system enables components to receive an evenly distributed cooling airflow after a failure of a fan.

Another particular embodiment may include one or more louvers that remain at least open when the fans are properly functioning, but closed when there is a fan failure. The opening and closing of the louvers may be accomplished mechanically or automatically. During normal operation, the embodiment of the system may add no impedance. That is, the total impedance within the chassis may remain low, while airflow is evenly distributed among system components. This may be accomplished by keeping adjusting the louvers according to a voltage of the blowers, for instance.

Figure 1:
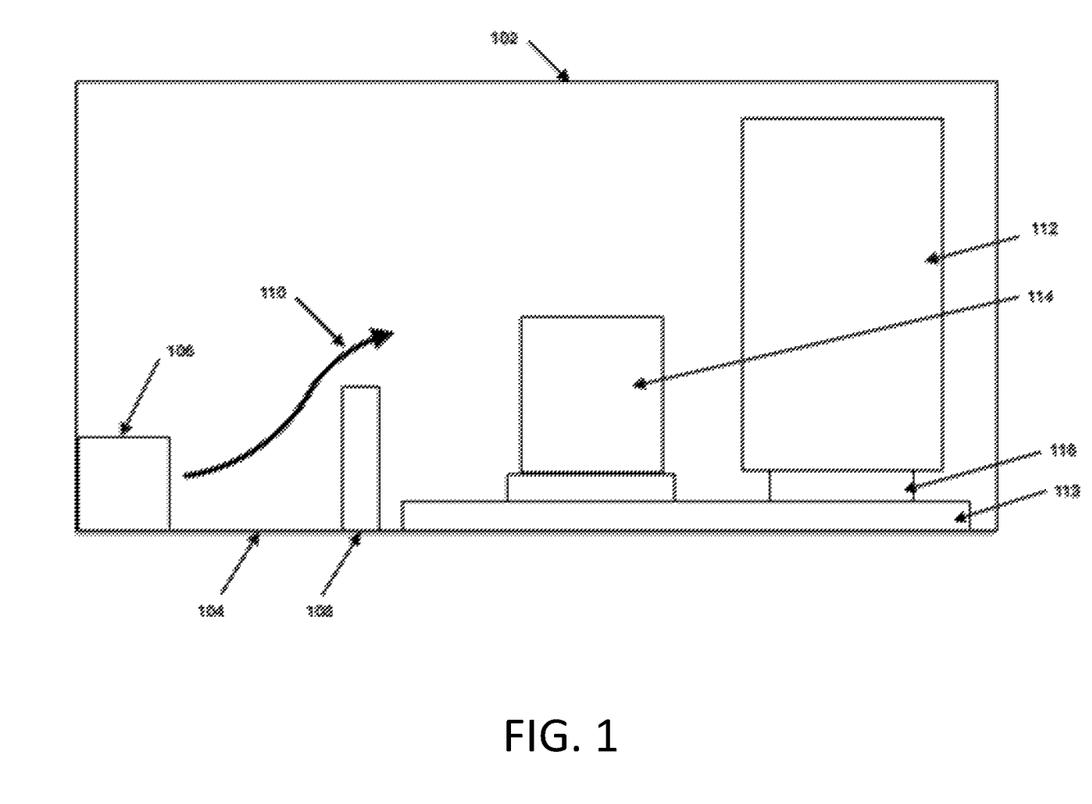
FIG. 1 is a side view of a system that includes a chassis having a cooling assembly comprising a plenum bounded by a plurality of airflow moving devices (AMD), or blowers, and a wall structure.

Turning now to the Drawings, FIG. 1 is a side view of a system 100 that includes a chassis 102 having a cooling assembly comprising a plenum 104 bounded by a plurality of airflow moving devices (AMD), or blowers 106, and a wall structure 108. A path 110 of the airflow from the blowers 106 flows over the top of the wall structure 108 and is distributed over and around electrical components. Illustrative components shown in FIG. 1 that are cooled by the distributed airflow and mounted on a main planar 113 may include heat sinks 112, cards 114, and modules 116.

Figure 2:
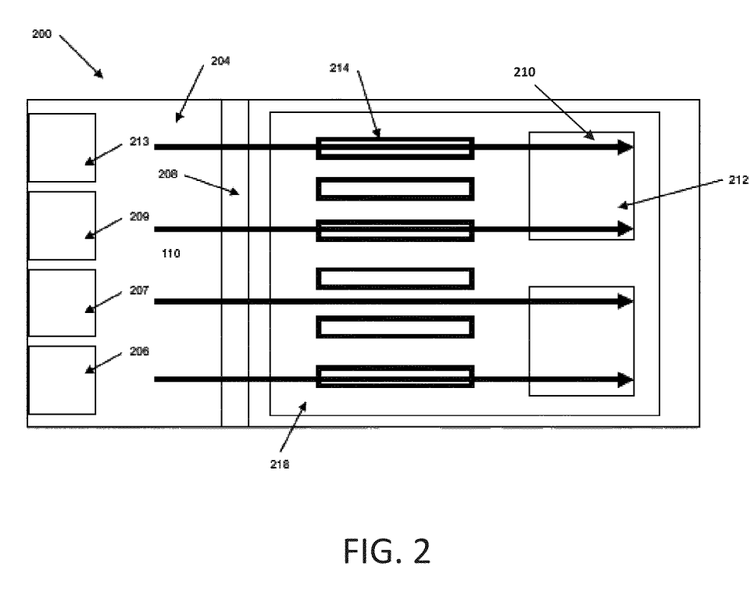
FIG. 2 is top view of a system having a cooling assembly that includes a plenum defined by a wall structure.

FIG. 2 is top view of a system 200 having a cooling assembly that includes a plenum 204 defined by a wall structure 208. The system 200 may show a top view perspective of the path 110 of the airflow of the system 100 of FIG. 1. The airflow 210 from the blowers 206, 207, 209, 213 flows over the top of the wall structure 208 and is distributed over and cools heat sinks 212, cards 214, and a main planar 218. In the shown embodiment, all of the blowers 206, 207, 209, 213 are functioning.

Figure 3:
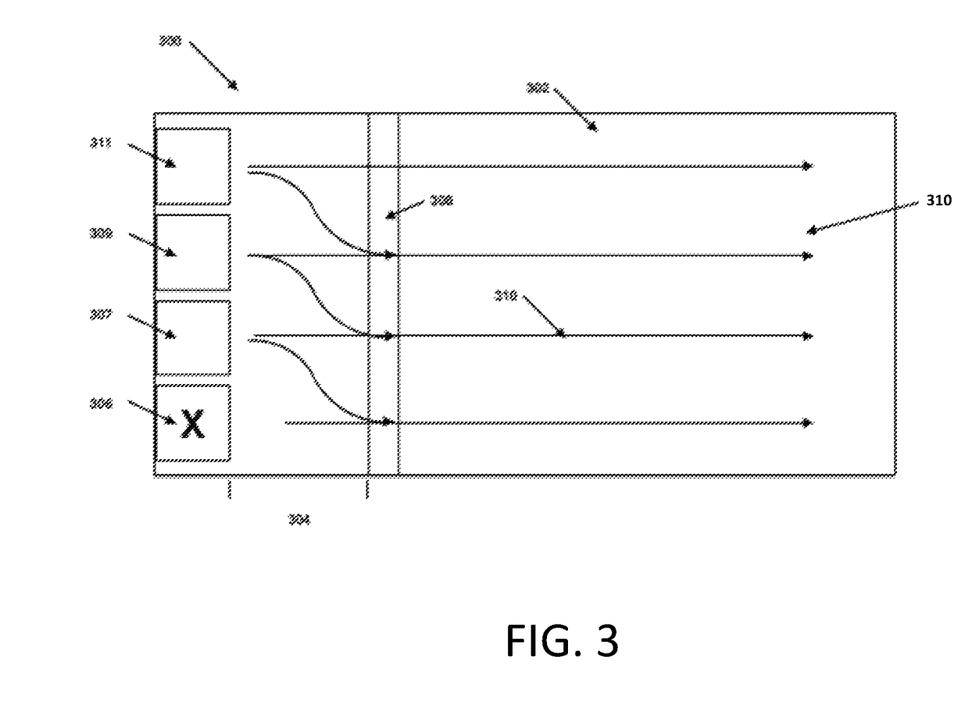
FIG. 3 shows a top view perspective of an embodiment of a system having a wall structure and a blower that has failed to function.

FIG. 3 shows a top view perspective of an embodiment of a system 300 having a wall structure 308 and a blower 306 that has failed to function. Other blowers 307, 309, 311 of the system 300 may continue to function. The airflow 310 is spread out substantially evenly throughout a plenum 304 and throughout a chassis 302.

Figure 4:
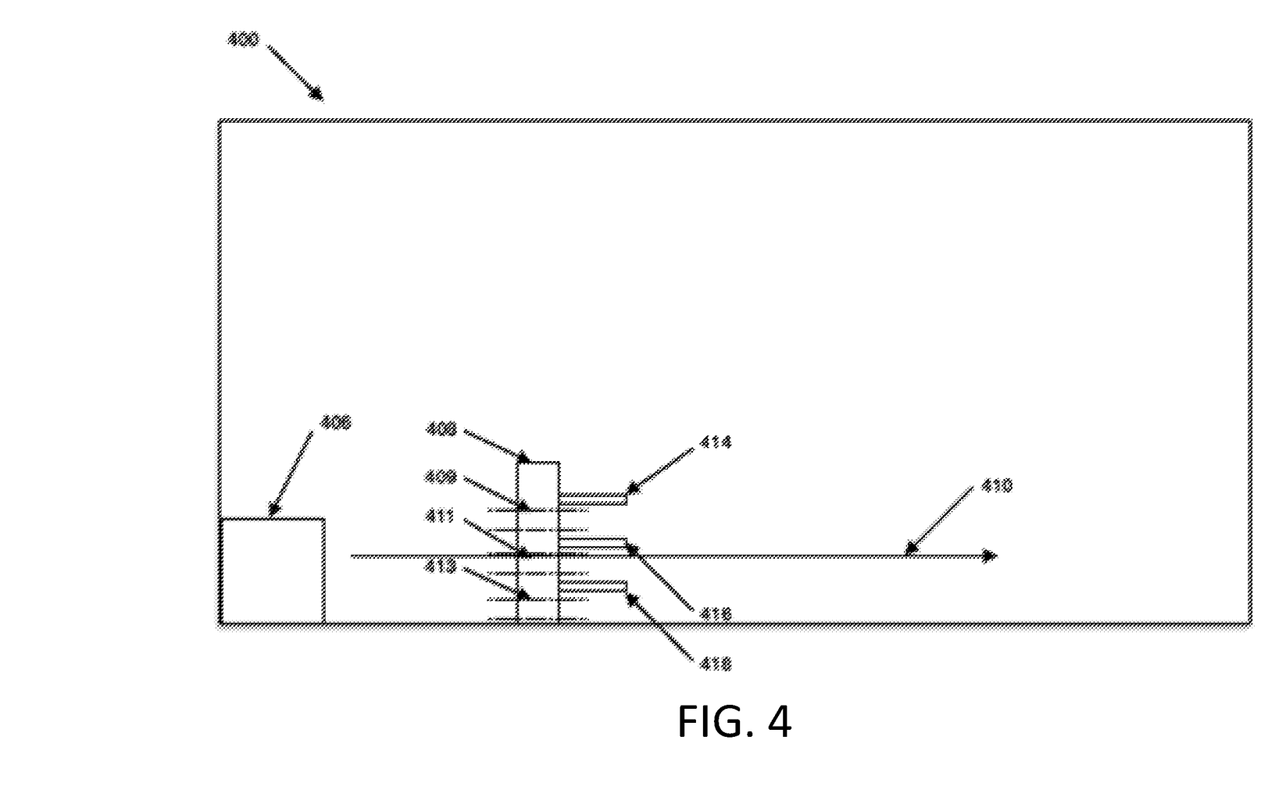
FIG. 4 shows a side view perspective of an embodiment of a system having a wall structure having wall apertures to allow the through-flow of air from a plurality of blowers.

FIG. 4 shows a side view perspective of an embodiment of a system 400 having a wall structure 408 having wall apertures 409, 411, 413 to allow the through-flow of air (e.g., the airflow 410) from a plurality of blowers 406. In the particular embodiment of the system 400, the wall apertures 409, 411, 413 have corresponding louvers 414, 416, 418. The louvers 414, 416, 418 are shown to be positioned on a side of the wall structure 408 that is opposes the blowers 406, though they may be mounted on the same side in another embodiment. The louvers 414, 416, 418 may be open during normal operation (e.g., when the blowers 406 are all functioning). In the manner, the plenum with the opened louvers 414, 416, 418 may have minimal effect on the overall impedance of the system 400. A direction and path of the airflow 410 may be similar to that of the airflow 210 shown from the top view perspective of FIG. 2.

Figure 5:
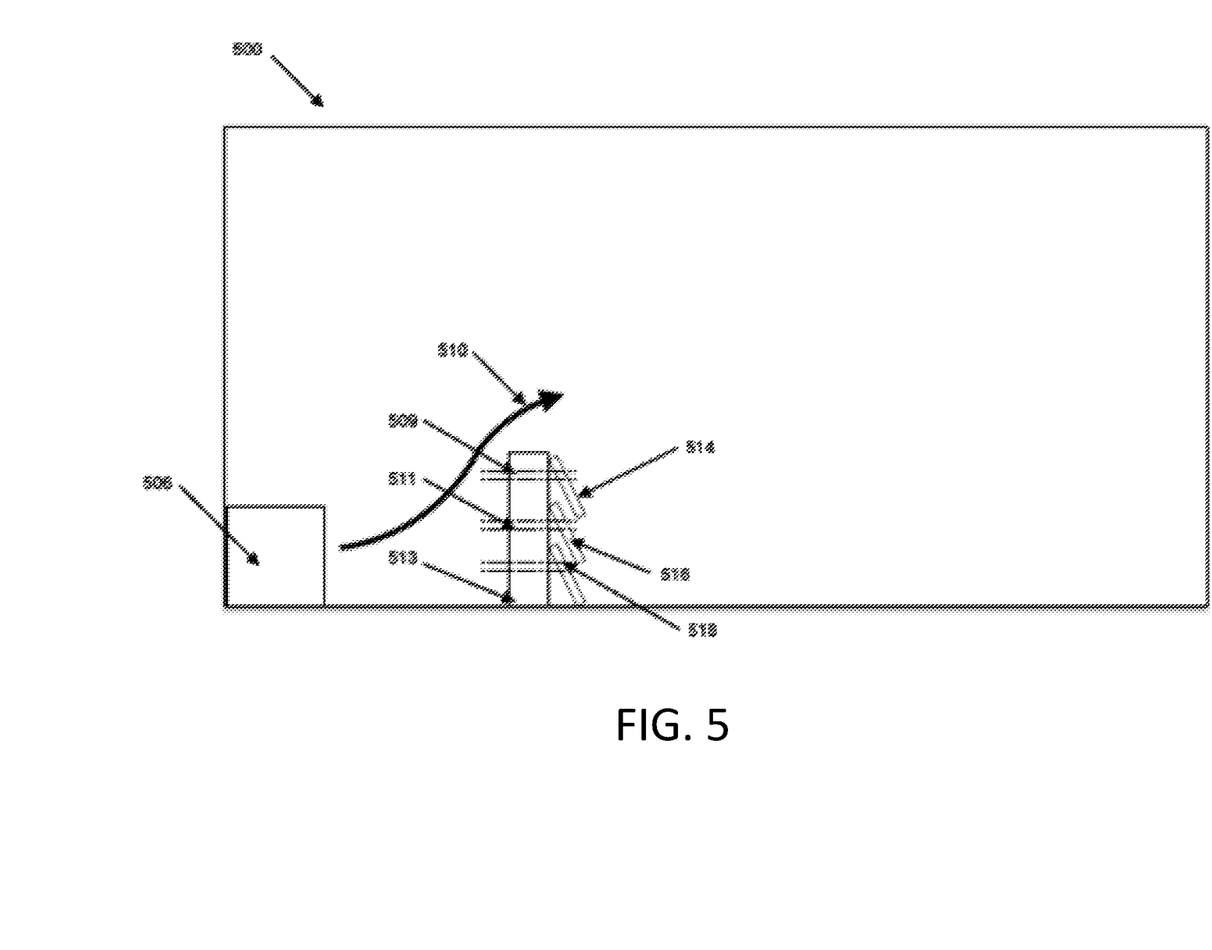
FIG. 5 shows a side view perspective of an embodiment of a system having a wall structure having wall apertures that are blocked by louvers.

FIG. 5 shows a side view perspective of an embodiment of a system 500 having a wall structure having wall apertures 509, 511, 513 that are blocked by louvers 514, 516, 518. The system 500 may be similar to the system 400 of FIG. 4, although with a malfunctioning blower 506. The louvers 514, 516, 518 may be automatically closed in response to a determination that the blower 506 has failed. Closure of the louvers 514, 516, 518 and corresponding wall apertures 509, 511, 513 may facilitate even airflow distribution. A direction and path of the airflow 510 within the system 500 may be similar to that of the airflow 310 shown in FIG. 3.

Figure 6:
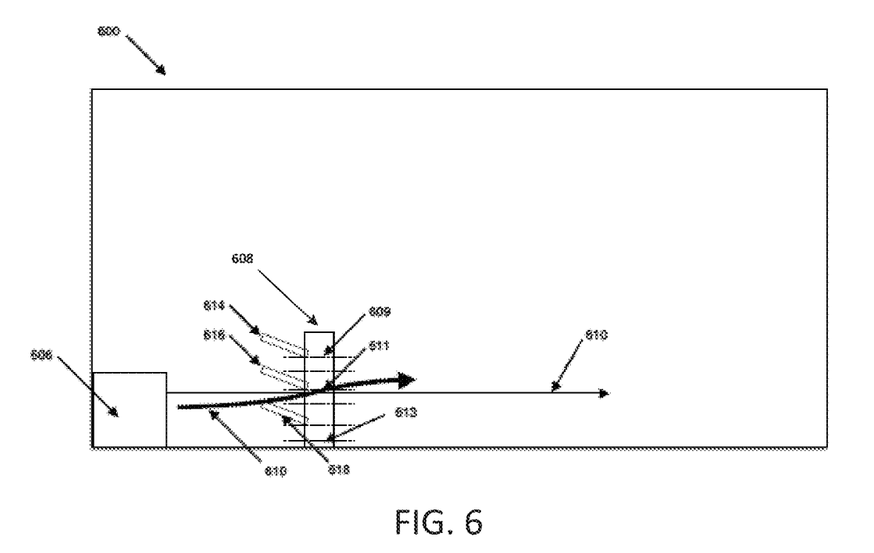
FIG. 6 shows a side view perspective of an embodiment of a system having a wall structure having louvers held open by gravity to allow the through-flow of air from a plurality of blowers through wall apertures.

FIG. 6 shows a side view perspective of an embodiment of a system 600 having a wall structure having louvers 614, 616, 618 held open by gravity to allow the through-flow of air (e.g., the airflow 610) from a plurality of blowers 606 through wall apertures 609, 611, 613. The position of the louvers 614, 616, 618 in FIG. 6 is largely unaffected by low air flow/low pressure. The louvers 614, 616, 618 are shown to be positioned on a side of the wall structure 608 that faces the blowers 606; however, they may be mounted on an opposing side in another embodiment. The louvers 614, 616, 618 may be open during normal operation (e.g., when the blowers 606 are all functioning). In the manner, the plenum with the opened louvers 614, 616, 618 may have minimal effect on the overall impedance of the system 600. A direction and path of the airflow 610 may be similar to that of the airflow 210 shown from the top view perspective of FIG. 2.

Figure 7:
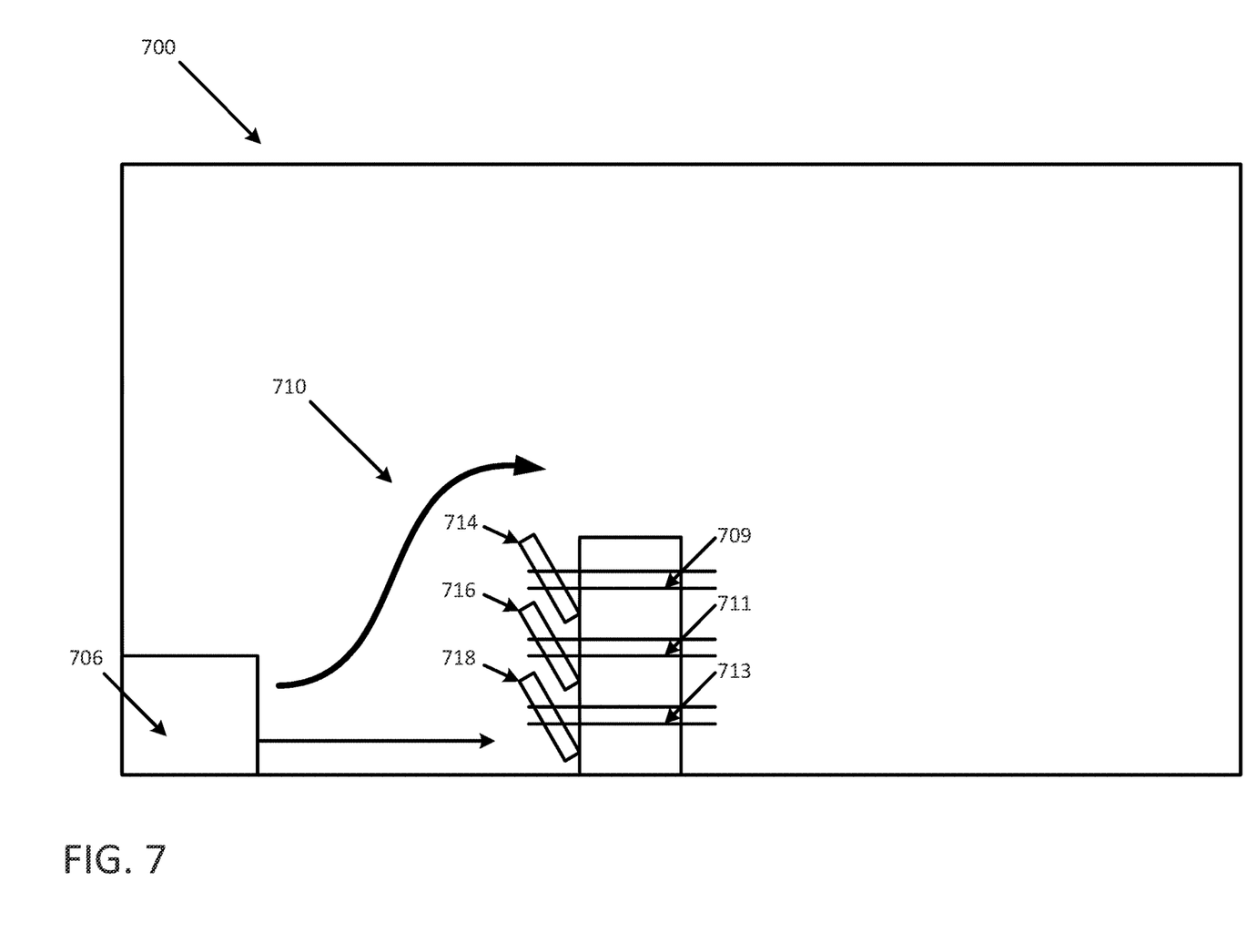
FIG. 7 shows a side view perspective of an embodiment of a system having a wall structure having wall apertures that are blocked by louvers.

FIG. 7 shows a side view perspective of an embodiment of a system 700 having a wall structure having wall apertures 709, 711, 713 that are blocked by louvers 714, 716, 718. The system 700 may be similar to the system 600 of FIG. 6, although with a malfunctioning blower 706. High airflow and high pressure may close the louvers 714, 716, 718 and force air over the wall structure 708. The arrangement may also be used to prevent recirculation at a distance from the blowers 706. Closure of the louvers 714, 716, 718 and corresponding wall apertures 709, 711, 713 may facilitate even airflow distribution. A direction and path of the airflow 710 of the system 700 may be similar to that of the airflow 310 shown in FIG. 3.

Figure 8:
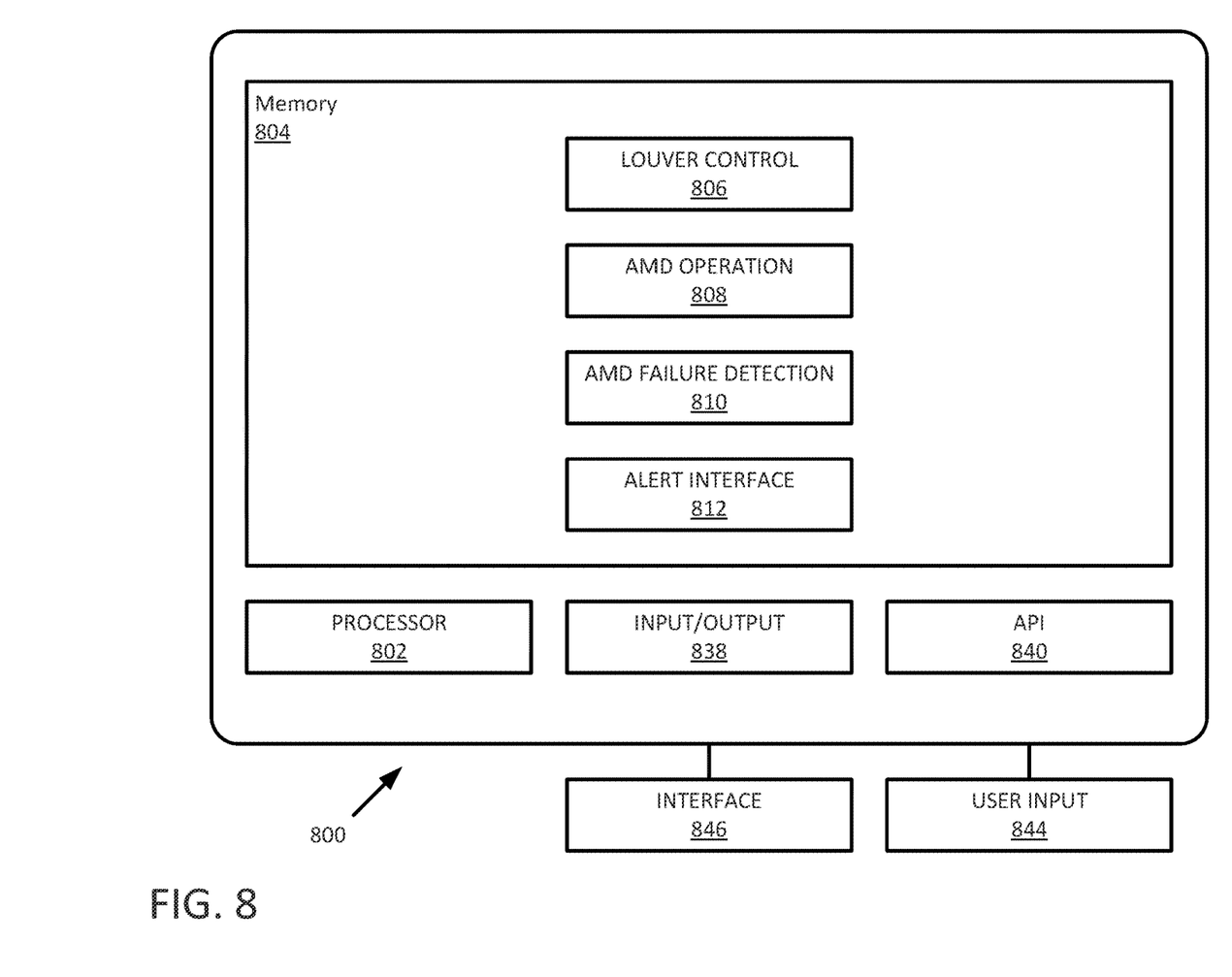
FIG. 8 is a block diagram of an embodiment of a system configured to use a wall structure and plenum to evenly distribute air to cool electronic components.

FIG. 8 is a block diagram of an embodiment of a system 800 configured to use a wall structure and plenum to evenly distribute air to cool electronic components. The illustrative system 800 includes a processor 802 and a memory 804. As represented in the block diagram, the memory 804 includes louver control module 806, an AMD operations module 808, an AMD failure detection module 810, and an alert interface module 812.

The system 800 may additionally include an input/output (I/O) 838 module and an application program interface (API) 840 to receive user requests and user feedback. To facilitate this interaction, the system may include a user interface 846.

Figure 9:
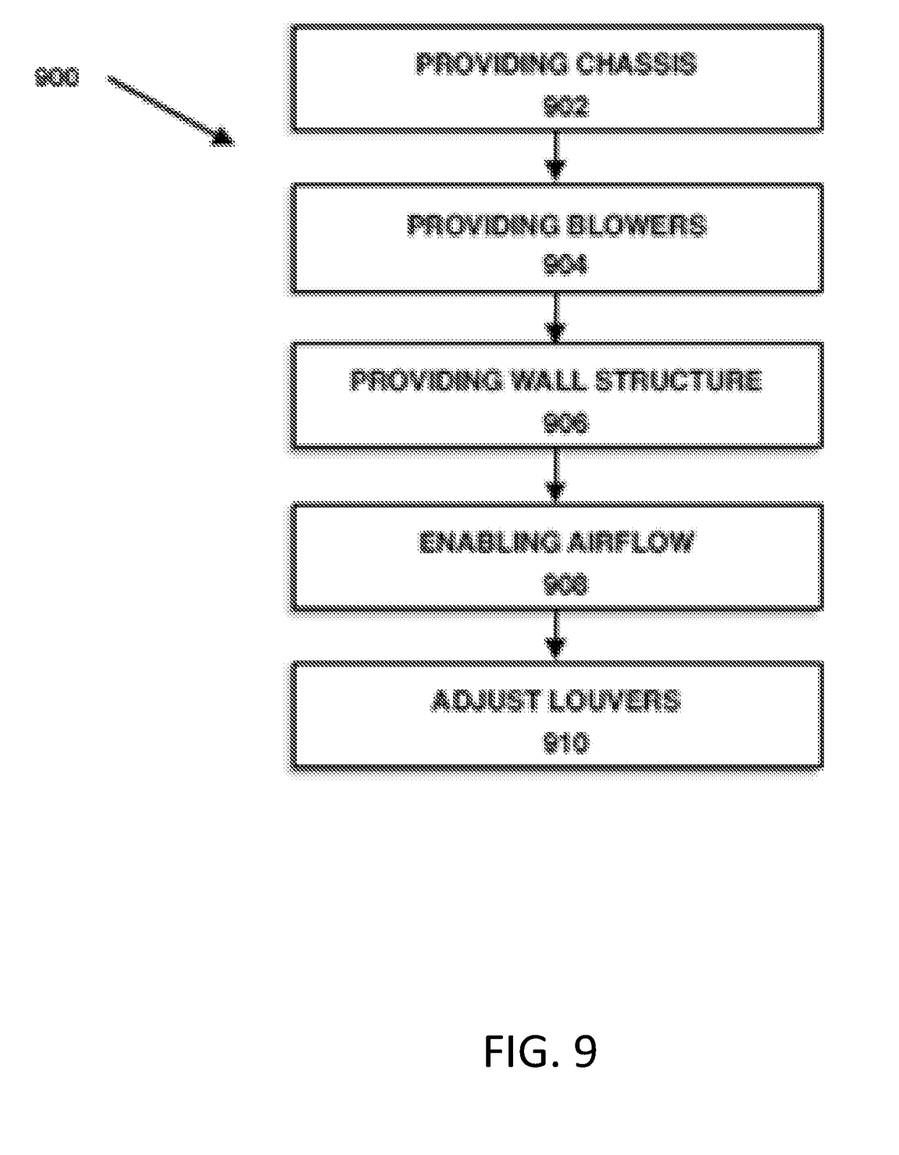
FIG. 9 is a flowchart of an embodiment of a method of using a wall structure and plenum to evenly distribute air to cool electronic components.

FIG. 9 is a flowchart of an embodiment of a method 900 of using a wall structure and plenum to evenly distribute air to cool electronic components. At 902, the method 900 may include providing a chassis. The chassis may include a plenum and may house circuitry and other components.

The method 900 may provide air moving devices (AMDs), such as blowers, at 904. The blowers may be positioned on the same surface as a base of a wall structure or on another surface. In some embodiments, the operational status of the blowers may be automatically monitored and reported. The wall structure may be positioned at 906. The wall structure may be attached to the based of the chassis.

Airflow may be enabled at 908 to cool the electronic components of the chassis. At 910, the louvers may be adjusted (e.g., either automatically or mechanically) in response to airflow, pressure, and desired impedance.

The louvers may be opened partially or completely based at least in part on the functional status of the AMDs. Other considerations may include a desired impedance and dimensions associated with the chassis. In one embodiment, the system may sense a voltage.

Figure 10:
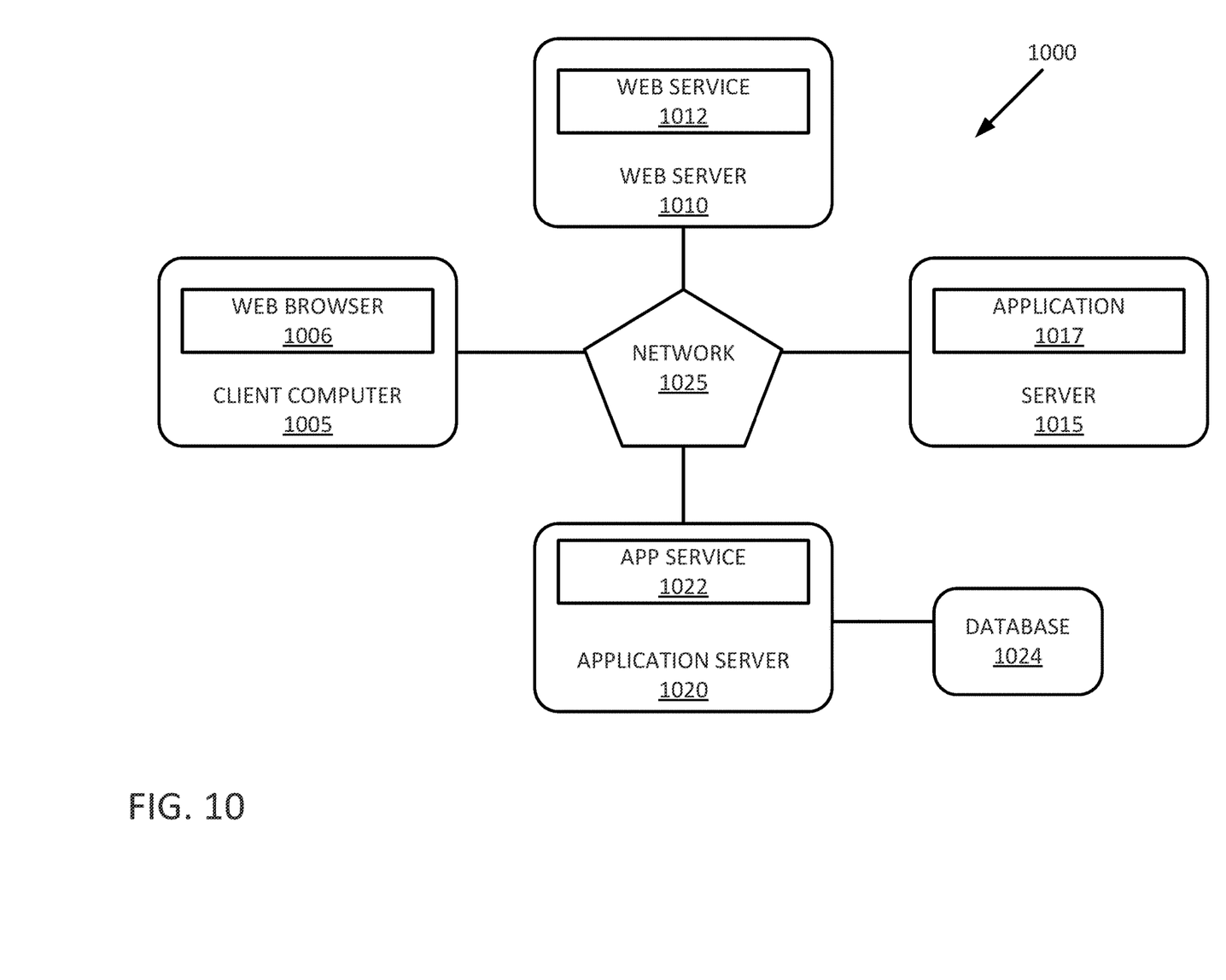
FIG. 10 illustrates another example computing system according to one embodiment, such as may be realized using a networked environment.

FIG. 10 illustrates another example computing system according to one embodiment, such as may be realized using a networked environment. As shown, the computing environment 1000 includes a client computer 1005, a web server 1010, a server 1015, and an application server 1020. The client computer 1005 may be a physical system (e.g., a desktop, laptop computer, mobile device, etc.) or a virtual computing instance executing in the cloud. The client computer 1005 includes a web browser 1006 A user may access data services through the web browser 1006 over a network 1025 (e.g., the Internet).

For instance, a user may access a web service 1012 executing on a web server 1010. In one embodiment, the web service 1012 provides a web interface for an application server 1020 (e.g., executing an application service 1022). More specifically, the application service 1022 provides a database 1024. The database 1024 may include data presented to users on the web browser 1006.

Figure 11:
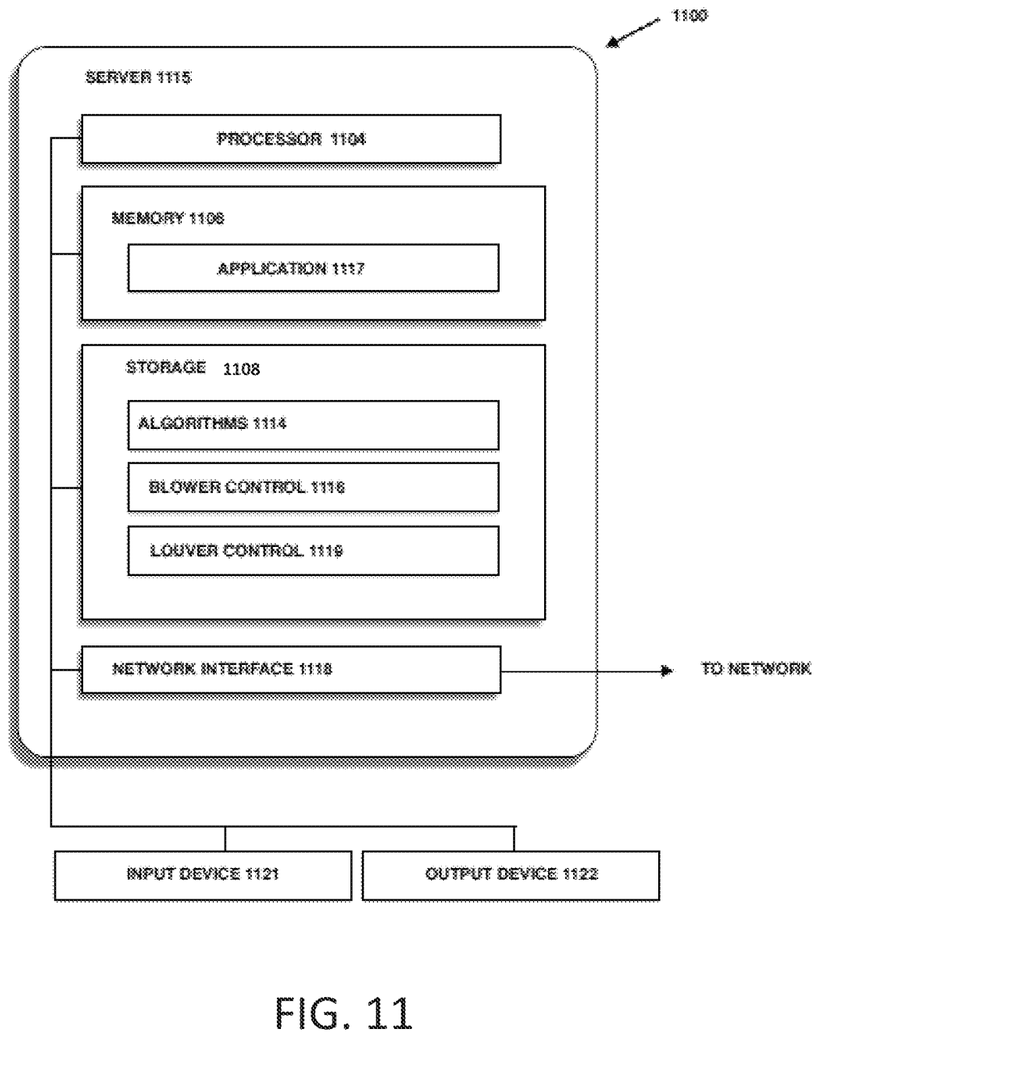
FIG. 11 further illustrates a server, such as the server of FIG. 10, according to one embodiment.

FIG. 11 further illustrates a server 1115, such as the server 1015 of FIG. 10, according to one embodiment. The server 1115 generally includes a processor 1104 connected via a bus to a memory 1106, a network interface device 1118, a storage 1108, an input device 1121, and an output device 1122. The server 1115 is generally under the control of an operating system. Examples of operating systems include the UNIX operating system, versions of the Microsoft Windows operating system, and distributions of the Linux operating system (UNIX is a registered trademark of The Open Group in the United States and other countries. Microsoft and Windows are trademarks of Microsoft Corporation in the United States, other countries, or both. Linux is a registered trademark of Linus Torvalds in the United States, other countries, or both). More generally, any operating system supporting the functions disclosed herein may be used. The processor 1104 is included to be representative of a single CPU, multiple CPUs, a single CPU having multiple processing cores, and the like. Similarly, the memory 1106 may be a random access memory. While the memory 1106 is shown as a single identity, it should be understood that the memory 1106 may comprise a plurality of modules, and that the memory 1106 may exist at multiple levels, from high speed registers and caches to lower speed but larger DRAM chips. The network interface device 1118 may be any type of network communications device allowing the server to communicate with other computers via the network.

The storage 1108 may be a persistent storage device. Although the storage 1108 is shown as a single unit, the storage 1108 may be a combination of fixed and/or removable storage devices, such as fixed disc drives, solid state drives, removable memory cards, optical storage and network storage systems.

As shown, the memory 1106 contains the application 1117, which may be an application generally executed to take actions described herein. Storage 1108 contains the algorithms 1114, blower control 1116, and louver control 1119.

The input device 1121 may provide a keyboard and/or a mouse, etc. The output device may be any conventional display screen. Although shown separately from the input device 1121, the output device and input device 1121 may be combined. For example, a display screen with an integrated touch-screen may be used.

The descriptions of the various embodiments of the present invention have been presented for purposes of illustration, but are not intended to be exhaustive or limited to the embodiments disclosed. Many modifications and variations may be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It may be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It may also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Embodiments of the invention may be provided to end users through a cloud computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g. an amount of storage space consumed by a user or a number of virtualized systems instantiated by the user). A user can access any of the resources that reside in the cloud at any time, and from anywhere across the Internet. In context of the present invention, a user may access applications (e.g., threshold adjustment algorithms) or related data available in the cloud. For example, the modules of FIG. 1 could execute on a computing system in the cloud and. In such a case, the threshold adjustment algorithms could adjust response thresholds and store the new values at a storage location in the cloud. Doing so allows a user to access this information from any computing system attached to a network connected to the cloud (e.g., the Internet).

While the foregoing is directed to embodiments of the present invention, other and further embodiments of the invention may be devised without departing from the basic scope thereof. While certain embodiments are applicable to spoken language systems, the claims are not limited or even particularly applicable to spoken language interfaces. In one example, an embodiment of a method may not relate to speech modality. The scope thereof is thus determined by the claims that follow.

What is claimed is:

1. A method of providing cooling to electronics, the method comprising:

providing a chassis to house circuitry, the chassis having a first and second surfaces, and an air inlet;
providing an airflow moving device to create an airflow in a first direction that is communicated to the chassis via the air inlet;
providing a wall structure including:
a height that extends up from the first surface towards the second surface to form an elongated opening between a top surface of the wall structure and the second surface;
a width that is solid but for a wall aperture through the width of the wall structure to allow through-flow of air in the first direction; and
a length that extends across a width of the chassis and is substantially perpendicular to the first direction;
providing a louver connected to the wall structure to close the wall aperture in response to the airflow on the louver being above an airflow threshold and open the wall aperture in response to the airflow on the louver being below the airflow threshold; and
enabling the air to flow over the top surface of the wall structure through the elongated opening.

2. The method of claim 1, further comprising forming a plenum region that includes a space between the wall structure and the airflow moving device.

3. The method of claim 1, further comprising closing the wall aperture via the airflow pushing the louver from a first angle relative to the first direction to a second angle relative to the first direction to be substantially perpendicular to the first direction at the second angle.

4. The method of claim 1, further comprising at least partially closing the wall aperture based on a voltage level measured at the airflow moving device.

5. The method of claim 1, further comprising initiating closing the wall aperture at a processor.

6. The method of claim 1, further comprising determining a dimension of the wall structure according to voltage and impedance specifications of the circuitry and a dimension of the chassis.

7. The method of claim 1, wherein the airflow moving device is one of a plurality of air moving devices.

8. The method of claim 1, further comprising positioning the circuitry on an opposite side of the wall structure relative to the airflow moving device.

9. An apparatus comprising:
a chassis including a first side including an air inlet and a second side including circuitry, a first surface running from the first side to the second side and a second surface, substantially parallel to the first surface, running from the first side to the second side;
an airflow moving device to create an airflow in a first direction that is communicated to the chassis via the air inlet; and
a wall structure including
a bottom surface connected to the first surface of the chassis; and
a top surface opposite to the bottom surface;
a wall aperture defining a through-hole in the wall structure in the first direction;
wherein dimensions of the wall structure define:
a height that extends up from the bottom surface to the top surface, wherein an elongated opening is defined between the top surface of the wall structure and the second surface of the chassis;
a width in the first direction; and
a length that extends across a width of the chassis and is substantially perpendicular to the first direction, and
a louver rotatably connected to the wall structure and configured to block the airflow through the wall aperture when the airflow creates air pressure at the louver above a pressure threshold and to allow the airflow through the wall aperture when the airflow creates air pressure at the louver below the pressure threshold,
wherein the airflow flows over the top surface of the wall structure through the elongated opening.

10. The apparatus of claim 9, further comprising a plenum region that includes a space between the wall structure and the airflow moving device.

11. The apparatus of claim 9, wherein the wall aperture is at least partially closed based on a voltage level measured at the airflow moving device.

12. The apparatus of claim 9, wherein the airflow generated by the airflow moving device rotates the louver from a first position allowing the airflow to pass through the wall aperture to a second position blocking flow through the wall aperture.

13. The apparatus of claim 9, wherein a lack of the airflow generated by the airflow moving device allows gravity to rotate the louver from a first position blocking the airflow to a second position allowing the airflow to pass through the wall aperture.

14. A program product to initiate cooling electronic components housed in a chassis, the program product comprising a computer readable storage medium having computer readable program code embodied therewith, the computer readable program code executable by a processor to access a memory and to execute the program code to:
control an airflow moving device to create an airflow in a first direction that is communicated to the chassis via an air inlet;
control a louver to selectively block or permit airflow through a wall aperture in a wall structure, the wall structure including:
a height that extends up from a first surface of the chassis towards a second surface of the chassis opposite to the first surface to form an elongated opening between a top surface of the wall structure and the second surface;
a width but for the wall aperture defined through the width; and
a length that extends across a width of the chassis and is substantially perpendicular to the first direction;
wherein the louver is controlled to permit airflow through the wall aperture in response to airflow on the louver being below an airflow threshold and to block the airflow through the wall aperture in response to the airflow on the louver being above the airflow threshold; and
cause the air to flow over the top surface of the wall structure.

* * * * *